United States Patent [19]

Converse et al.

[11] Patent Number: 4,740,757

[45] Date of Patent: Apr. 26, 1988

[54] METHOD AND APPARATUS FOR LOCATING LEAKS IN A MULTIPLE LAYER GEOMEMBRANE LINER

[75] Inventors: Merle E. Converse; Thomas E. Owen, both of Helotes, Tex.

[73] Assignee: Southwest Research Institute, San Antonio, Tex.

[21] Appl. No.: 934,640

[22] Filed: Nov. 25, 1986

[51] Int. Cl.$^4$ .................. G01R 31/00; G01V 3/10
[52] U.S. Cl. .................... 324/559; 324/557; 324/326; 340/605
[58] Field of Search .................. 324/557–559, 324/551, 553, 554, 544, 541, 527–529, 530, 326, 254; 340/603–606

[56] References Cited

U.S. PATENT DOCUMENTS

| | | | |
|---|---|---|---|
| 3,526,831 | 9/1970 | Smith | 324/559 |
| 4,390,836 | 6/1983 | Bruce et al. | 324/557 |
| 4,475,078 | 10/1984 | Itani | 324/254 X |
| 4,543,525 | 9/1985 | Boryta | 324/559 O |

Primary Examiner—Reinhard J. Eisenzopf
Assistant Examiner—Jack B. Harvey
Attorney, Agent, or Firm—Gunn, Lee & Jackson

[57] ABSTRACT

A leak detection and location method and apparatus for detection of perforations in a obscure geomembrane liner is set forth. In a typical application, upper and lower liners are positioned contiguous to one another and a conducting liquid is placed between them. In the event a tear or perforation is formed in the lower liner, a current flow path is established from a power supply and conductors connected to the power supply. The current flow path extends through the liquid to the leak. Because of the liquid path through the liner, electric current will flow through the perforation and establish an associated magnetic field in the near vicinity of the leak. Magnetic sensors are then swept across the surface of or through the impounded liquid above the liners to indicate such magnetic field variations and the locations of such perturbations correspond to the locations of the leak perforations.

8 Claims, 1 Drawing Sheet

METHOD AND APPARATUS FOR LOCATING LEAKS IN A MULTIPLE LAYER GEOMEMBRANE LINER

FIELD OF THE INVENTION

This disclosure relates to an apparatus and method for determining the location of a leak in a geomembrane liner. More specifically, this invention is intended to detect leaks in a multi-layer geomembrane system where the leak is in an underlying geomembrane beneath one or more geomembranes and is therefore not otherwise accessible. The present disclosure sets forth both a method and an apparatus which locates a leak by virtue of electric current flow through a liquid otherwise inaccessible located between two geomembranes, leak detection occurring without the necessity of gaining access below the overlying geomembrane. This method and apparatus provides leak detection and leak location in the underlying geomembrane without the necessity of draining liquids impounded by the geomembrane system and without the necessity of visual inspection.

BACKGROUND OF THE INVENTION

Geomembrane liners are made of large sheets of flexible plastic or resilient material. The sheets are assembled, being one or more, to define a barrier which contains liquids in an impoundment. Such a liquid impoundment is normally built on the face of the earth after shaping a shallow pond. The pond may be filled with high quality drinking water. It may be used to store hazardous waste materials for subsequent processing and disposal. In general terms, the impoundment is normally intended to be secured gainst leakage and, to this end, the geomembrane liner is built to define the pond. Leaks must be detected and repaired to avoid significant leakage, potential ground water contamination, or loss of valuable product. The present disclosure is particularly directed to an impoundment made of two or more geomembrane liners and set forth a system of inspection so that leaks can be detected and located in any of the layers.

This disclosure thus relates to a geomembrane liner installation having an upper liner spaced above a lower liner. The two generally extend to the same marginal edge and are joined at the surrounding edge. The surrounding earth is normally shaped to define a shallow pond. The pond thus comprises the storage area above both liners. The risk of leakage through the lower liner makes detection all the more difficult because it is so totally obscured by the upper liner placed above it.

The system set forth by this disclosure has advantages over other methods of inspection. For example, monitoring wells around and perhaps extending beneath the pond can be used. Measurements so obtained through monitoring wells are generally indirect. Moreover, they are delayed in response time; by the time that a leak is detected through this approach, substantial leakage has already occurred and significant damage may well occur as a result of the untended leak. Monitoring wells can be rather shallow or can extend much deeper into strate therebelow which serve as aquifers. Detection of leaked constituents in the aquifer, even with detection that measures parts per billion is acceptable, but again it is significantly delayed and is therefore less desirable than the approach of the present disclosure. One alternate approach involves U.S. Pat. No. 4,543,525 directed to a directional probe system reading on a galvanometer. This system has different sensitivities along different probe angular positions. Therefore, a leak can be missed entirely by wrong probe orientation.

The present apparatus and method disclosed herein takes advantage of the fact that an electric current can be conducted by a liquid between the two liners. To this end, the liquid placed between the two liners is selected so that it is conductive at least to a specified level. A suitable power supply is connected between a first electrode in contact with the earth outside of the lower liner and a second electrode in contact with the liquid between the two liners. This arrangement represents an electrical circuit in which current may flow through the lower geomembrane which, by virtue of its material properties, is a high resistance interface between the first electrode and conducting earth and the second electrode and conducting liquid. As long as the lower liner is in perfect condition, and no leak has occurred, current flow will be of very low magnitude. In the event that a leak occurs in the lower liner, the conductive liquid passing through the perforation (be it large or small) will allow a measurable current flow. This current passes through the leak and produces an adjacent magnetic field which is detected in the manner and by the means described hereinbelow. An important factor to note is that leakage can be detected from inception of the perforation in the lower liner, and the position of such leakage can be quickly localized. This is particularly important in view of the fact that the lower liner is obscured. Moreover, the pond secured by the impoundment above the two liners can encompass many acres and thereby be quite large. This large size can nevertheless be safely and easily surveyed to detect and locate leaks by application of the present invention.

SUMMARY OF THE INVENTION

The present invention is summarized as both an apparatus and method for detecting leaks in an obscured or inaccessible geomembrane. In a typical pond formed by two or more overlaid liners, a liquid which is electrically conductive is placed between the liners. A circuit is completed from the terminals of a power supply to ground through one electrode and into the liquid at another electrode. When a leak occurs allowing the conductive liquid to migrate into the soil, a concentrated electric current will flow through the leak perforation to produce an associated magnetic field in the vicinity of the perforation or leak. The method of the present invention refers to this establishment of an electric current and related magnetic field associated with leak perforations in the geomembrane liner and the fact that the magnetic field is detectable without direct access to the electric current circuit. A suitable apparatus is also set forth for establishing the electric current and detecting the electric field.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this inven

DETAILED DESCRIPTION OF THE PREFERRED EMBODIMENT

Figure 1:
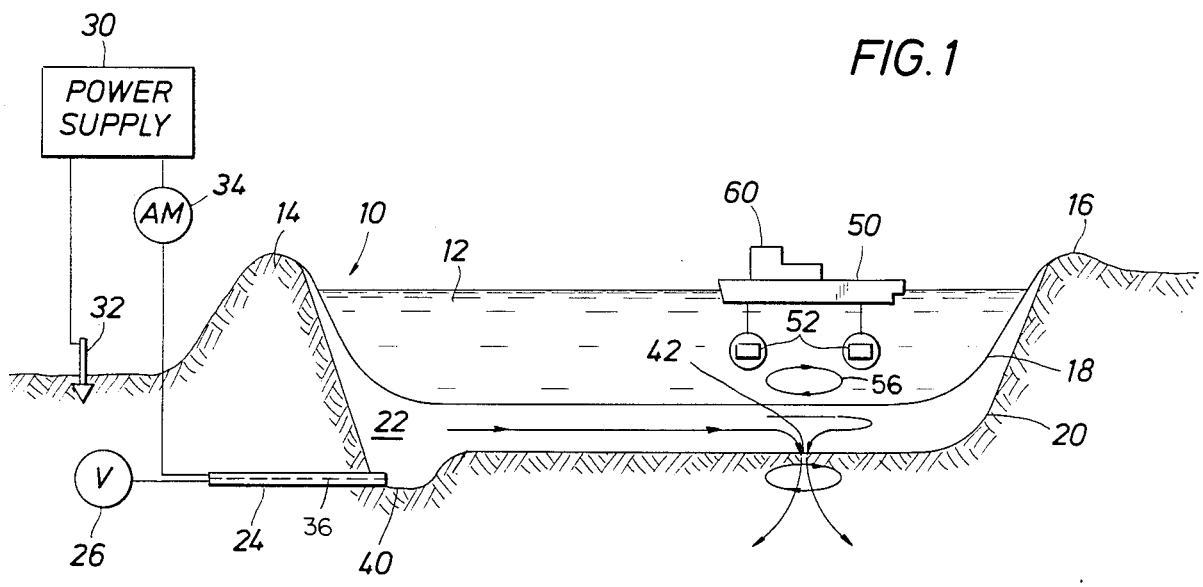
- FIG. 1 is a sectional view through a surface impoundment, defined by an upper liner above a lower liner, the lower liner being subject to a leak wherein the apparatus of the present disclosure is installed for detecting such a leak.

Attention is first directed to FIG. 1 of the drawings in which a geomembrane liner is defined for the confinement of an impounded liquid. The impoundment system is generally indicated by the numeral 10 enclosing a body of liquid 12. The size of the impoundment and the liquid within the impoundment may spread over several acres. It typically is built to dimensions to suit and is surrounded by an embankment such as that exemplified at 14. The two liners join together at a marginal edge 16. Ordinarily, the liner system is generally rectangular although it can have any shape desired. It is more or less uniform in depth although this can be varied as required. The system typically encloses water, although it can be used to impound oil or other liquids. The nature of the liquid 12 can vary widely.

The numeral 18 identifies the upper liner which is approximately coextensive with the lower liner 20. The vertical scale has been exaggerated to show the spacing between the two liners. The spacing is usually relatively close, but it is desirable in general terms that the two liners not contact except at the marginal edge 16. To facilitate the leak detection process, a liquid is placed between the two liners and is identified by the numeral 22. The liquid 22 is a liquid which will conduct electric current. As an example, salt water will suffice. However, other liquids are also conductive and may be used. The choice of water is in part dependent on climate conditions including freezing temperatures.

A drain pipe 24 opens at one end into the space between the two liners. At the other end, it connects with a suitable valve 26 and can be connected as a fill line, or can be used to drain the space between membranes. An electrical power supply 30 is connected in the system. The power supply has one terminal which is connected to a suitable ground electrode 32. Ordinarily, electrode 32 is driven into the earth to a suitable depth to define a ground return path. The other terminal of the power supply connects serially through an ammeter 34 into a conductor electrode 36 conveniently placed in the drain pipe 24 and extending into the cavity between the two liners. The conductor 36 terminates at some point in the region of the drain pipe. Conveniently, the pond is shaped to have a sump region 40 at one end of the pond. The drain pipe is connected into the space between the two liners near or in the sump so that the pipe can be used to fill or drain substantially the entire volume between the two liners.

Typically, the liners 18 and 20 are made of relatively thin plastic sheet material. They are typically fabricated in rectangular sheets and are joined at seams thereby defining the liquid impoundment. Assume that a small perforation is formed in the lower liner 20. A perforation is represented at 42. The perforation allows liquid to leak into the subsoil below the lower liner 20.

The apparatus of the preferred embodiment utilizes a mobile magnetic field measuring system. The numeral 50 identifies a small boat which traverses the surface of the liquid 12. The boat can be towed or driven by a self-contained power apparatus and is moved in a controllable pattern as for instance by traveling the surface in a rectilinear or raster scan pattern. It supports transducer means which are identified as magnetic field sensors 52. In the preferred embodiment, two or more such sensor devices are mounted below the boat 50. They are suspended at a depth in the pond below the surface of the liquid. The transducers are positioned relatively close to the bottom of the pond. For instance, if the pond is about six feet deep, the boat and sensors are arranged so that the detectors 52 are located at a depth closer to the bottom than to the top of the impounded liquid. This increases the sensitivity of the transducer system to small leaks. Alternate methods of mobilizing and scanning the magnetic field sensors 52 are possible. For example, by mounting the sensors on a hand-held probe and with the use of an appropriate detector electronics unit 60, the sensors may be manually scanned by an operator traversing the impoundment in a conventional boat or by wading directly in the impounded liquid 12.

Figure 2:
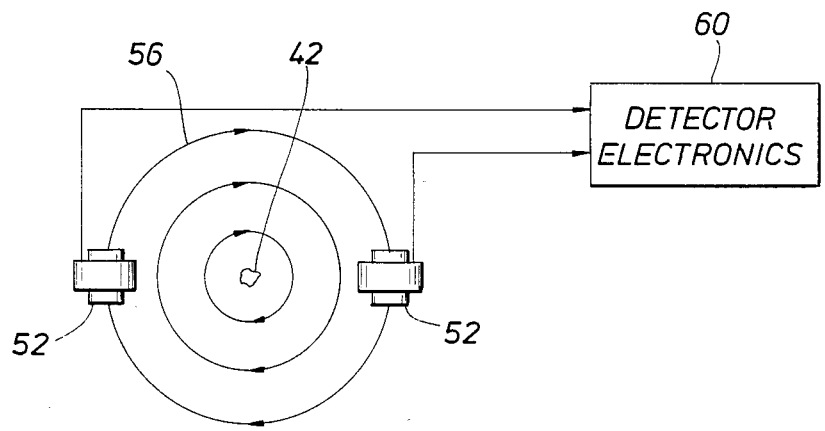
FIG. 2 is a plan view of the magnetic field formed around a leak or perforation in the lower liner.
Figure 3:
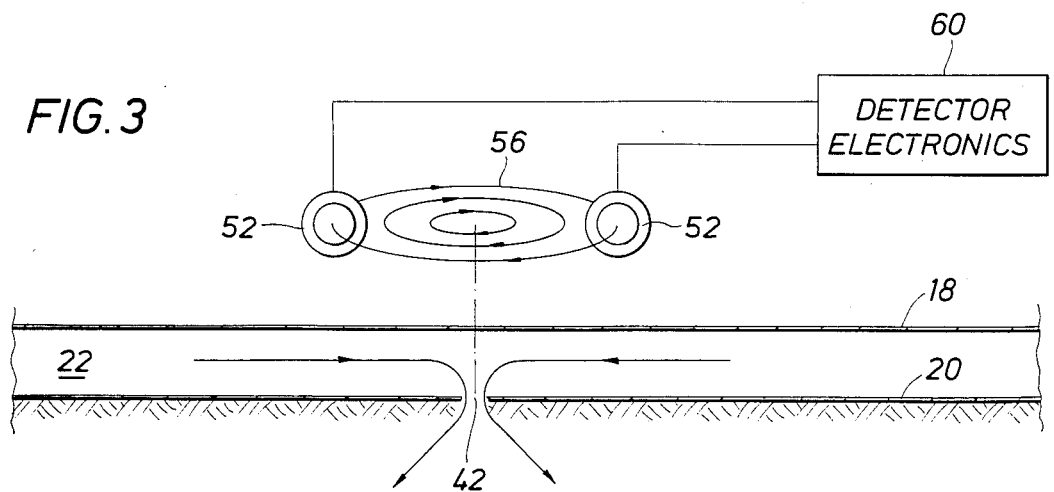
FIG. 3 is a sectional view of the membranes and leak and shows the electric current pattern and magnetic field also depicted in FIG. 2.

Attention is now directed to FIGS. 2 and 3 of the drawings considered jointly where the two liners are shown to be approximately parallel to one another with the liquid 22 located therebetween. The leak 42 is represented in both views. The leak 42 is a small tear or perforation in the lower liner 20. The present apparatus operates in accordance with the following theory. The leak 42 is an outlet for the conductive liquid. After the liquid passes through the perforation 42, it enables an electrical current to flow through the leak or perforation at 42. As viewed in the drawings, this sets up a magnetic field identified by the flux lines at 56. These flux lines are established by the current flow. They are located concentrically around the location of the perforation or leak. This is true whether the leak is precisely circular or is elongate as might occur with a tear. The current flow path is from the power supply 30 shown in Fig. 1 through the conductor 36, into the liquid 22, through the perforation 42, through the earth, to ground electrode 32. Should the lower liner have no leaks, the current flow is essentially zero for DC current. In fact, the ammeter 34 will indicate almost no current whatsoever, except such current as might flow through the high resistance material making up the liner 20. If the liner is an electrical insulator, the current observed at the ammeter 34 will be small, measured perhaps in microamperes. When a perforation is present, the current might increase by a factor of 1,000 or greater even for a small leak. The ammeter 34 can therefore be monitored as an indication of the current flow. DC current from the supply 30 can thus be monitored to determine the presence or absence of a leak. A change in the current flow thereby indicates the existence of a leak.

The leak detection process can then be undertaken by use of the small boat 50. It is moved across the surface of the pond to detect magnetic anomalies of the sort illustrated at 56 in FIGS. 2 and 3. If the current flow through the tear or perforation 42 is a DC current, the lines of magnetic flux 56 are established substantially stationary in view of the fact that current flow is substantially invariant. The current completes the return flow path back to the ground electrode 32. The stationary magnetic field associated with the leak must be then located. As the boat moves the magnetic transducers 52 over the region of the leak to detect and define the magnetic field an indication is observed. It is not necessary for the boat to be moving in order to detect the leak.

The detectors 52 are preferably duplicated so that more than one signal can be sensed. To this end, the detectors 52 are connected to detector electronics indicated generally at 60. One embodiment of this sytem presents the detected signals from the coils 52, typically induction coils. Alternate magnetic field sensors are magnetometers such as fluxgate vector magnetometers or proton precission total field magnetometers. A variety of devices can be used as the transducers 52. This arrangement also allows the use of alternate types of detectors to detect either DC or AC magnetic fields 56 formed as a result of the leak.

A suitable method of operation is to apply a DC current to the system as shown in FIG. 1. If there is no leak, the current is of very low magnitude. Typically, it will be in the range of just a few microamperes. This is a desirable threshold value. Alternately, an AC current can be used. There will, however, be an AC current flow indicated by the ammeter 34. The current flow depends on the frequency and the size of the impoundment. The impoundment and liner arrangement acts as a large distributed capacitor. One plate of the capacitor is the conductive liquid 22 The insulator of the capacitor is the membrane 20. The second plate of the capacitor can either be the impounded liquid 12 thereabove or the earth under the lower liner 20. In any event, there will be a steady state AC current depending on scale factors even before a leak has occurred. If a leak exists, there will be a larger current flow indicated by the ammeter 34. It will be therefore understood that whether the power supply current is AC or DC there is a baseline value which is indicative of the onset of a leak. When a leak is suspected, the impoundment of the pond is then scanned to detect and locate the leak. Presume that the operator cannot see through the liquid 12 and there is no visual inspection technique available to locate the perforation 42. The sensor means including the transducer assembly 52 is moved across the surface of or through the liquid time and time again in a regular pattern. Signals are noted at the detector electronics 60 which then can be interpreted to locate the position of the leak 42. As will be understood, if the leak is relatively large, the current will increase more or less in proportion to the size of the perforation. The liquid forms a distributed resistance in the electric current path, and the area of the perforation 42 defines the area of the current flow path and hence the relative amplitude of the current.

The foregoing sets forth both the method and apparatus of the present invention directed primarily at locating a small perforation in an obscured or inaccessible geomembrane liner. While the foregoing sets forth the preferred embodiment, the scope is determined by the claims which follow.

What is claimed is:

1. An apparatus for locating a leak in a geomembrane liner, said liner having an upper face in contact with a conductive liquid and having a lower face in contact with surrounding material, said conductive liquid being further contained between said geomembrane liner and an overlying upper liner whereby said geomembrane liner is obscured from inspection and wherein said overlying upper liner defines an impoundment having an impounded liquid therein, said apparatus comprising:

means for injecting a current into said conductive liquid between said geomembrane liner and said overlying upper liner to thereby create a current flow in said conductive liquid, whereby said current flow passes through said leak into said material surrounding said geomembrane liner;

magnetic field sensor means for detection of lines of magnetic flux created by said current flow;

detection means connected to said sensor means for forming an output signal corresponding to said lines of magnetic flux created by said current flow; and means for housing said detection means and supporting said sensor means in said impounded liquid.

2. The apparatus of claim 1 wherein said current injection means comprises:

a power supply having first and second terminals;

a conductor electrode extending into said conductive liquid;

means for connecting said conductor electrode to said first terminal of said power supply;

conduit means passing through said material surrounding said geomembrane liner, in fluid communication with said conductive liquid, said connecting means being at least partially located within siad conduit means;

a ground electrode driven into said material surrounding said geomembrane liner, said ground electrode being connected to said second terminal of said power supply; and means for measuring current from said power supply.

3. The apparatus of claim 2 wherein said support means comprises a boat.

4. The apparatus of claim 2 wherein said sensor means comprises induction coils.

5. The apparatus of claim 2 wherein said sensor means comprises fluxgate magnetometers.

6. The apparatus of claim 2 wherein said power supply generates DC current.

7. The apparatus of claim 2 wherein said power supply generates AC current.

8. A method of determining the location of a leak in a geomembrane liner, said liner having an upper face in contact with a conductive liquid and having a lower face in contact with surrounding material, said conductive liquid being further contained between said geomembrane liner and an overlying upper liner whereby said geomembrane liner is obscured from inspection and wherein said overlying upper liner defines an impoundment having an impounded liquid therein, said method comprising the steps of:

(a) defining a current flow path from a power supply into said conductive liquid and through said leak into said material surrounding said geomembrane liner by employing a conductor electrode extending into said conductive liquid, said conductor electrode being connected to a first terminal of said power supply by connection means, said connectin means being located within a conduit in fluid communication with said conductive liquid, said power supply further having a second terminal connected to a ground electrode, said ground electrode being driven into said material surrounding said geomembrane liner;

(b) placing a magnetic field measuring means in the vicinity of said impounded liquid for scanning said impoundment to detect magnetic field perturbations arising from said current flow path through said leak, said magnetic field measuring means being suspended in said impounded liquid by a support structure; and (c) correlating said magnetic field perturbations to said leak in said geomembrane liner.

* * * * *